(12) United States Patent
Chan

(10) Patent No.: US 7,820,596 B2
(45) Date of Patent: Oct. 26, 2010

(54) THICK FILM HIGH TEMPERATURE SUPERCONDUCTING DEVICE SUPPORTING HIGH CRITICAL CURRENTS AND METHOD FOR FABRICATING SAME

(75) Inventor: Siu-Wai Chan, Demarest, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 1633 days.

(21) Appl. No.: 10/381,342

(22) PCT Filed: Oct. 23, 2001

(86) PCT No.: PCT/US01/51078

§ 371 (c)(1),
(2), (4) Date: Sep. 24, 2004

(87) PCT Pub. No.: WO02/45133

PCT Pub. Date: Jun. 6, 2002

(65) Prior Publication Data

US 2005/0043183 A1    Feb. 24, 2005

Related U.S. Application Data

(60) Provisional application No. 60/242,586, filed on Oct. 23, 2000.

(51) Int. Cl.
H01B 12/02    (2006.01)
(52) U.S. Cl. .............. 505/320; 505/230; 505/430; 505/434; 505/450; 505/500; 428/930

(58) Field of Classification Search .......... 505/100, 505/150, 230, 238, 320, 430, 434, 450
See application file for complete search history.

(56) References Cited

U.S. PATENT DOCUMENTS

| 4,997,808 A | * | 3/1991 | Chatterjee et al. ........... 505/233 |
| 4,997,809 A | * | 3/1991 | Gupta ........................ 505/410 |
| 5,126,315 A | * | 6/1992 | Nishino et al. .............. 505/181 |

(Continued)

FOREIGN PATENT DOCUMENTS

WO    WO 99/03159    *    1/1999

OTHER PUBLICATIONS

Malozemoff et al, "Low Cost YBCO coated conductor technology," Superconduct. Sci. Tech., 2000, 13(5), pp. 473-746.*

(Continued)

*Primary Examiner*—Stanley Silverman
*Assistant Examiner*—Kallambella Vijayakumar
(74) *Attorney, Agent, or Firm*—Baker Botts L.L.P.

(57) ABSTRACT

A thick film superconductor includes a substrate and a superconducting thick film formed on the substrate. The thick film is 1-20 microns thick with an average twin spacing to film thickness ratio of about 0.016, and is formed from an aqueous solution of YBC ions doped with a particulate rare earth oxide having a diameter of about 50-500 nm. The coated substrate is heat treated, preferably above 650 degrees C. and cooled at a rate less than 15 degrees C. per hour, resulting in a substantially fully oxygenated YBCO layer.

22 Claims, 5 Drawing Sheets

U.S. PATENT DOCUMENTS

| | | | | |
|---|---|---|---|---|
| 5,158,930 | A | * | 10/1992 | Nellis et al. ................. 505/401 |
| 5,179,073 | A | * | 1/1993 | Yamazaki ................... 505/480 |
| 5,240,903 | A | * | 8/1993 | Shimoyama et al. ........ 505/125 |
| 5,318,948 | A | * | 6/1994 | Okada et al. ................ 505/230 |
| 5,326,745 | A | * | 7/1994 | Nishino et al. .............. 505/220 |
| 5,430,008 | A | * | 7/1995 | Morris ....................... 505/150 |
| 5,523,284 | A | * | 6/1996 | Fagan et al. ................. 505/501 |
| 5,651,839 | A | * | 7/1997 | Rauf ........................... 148/95 |
| 6,136,756 | A | * | 10/2000 | Langbein et al. ............ 505/450 |

OTHER PUBLICATIONS

Miura et al.,"AStructural and electrical properties of liquid phase epitaxially grown Y1Ba2Cu3Ox films," 1997, (278), pp. 201-206.*

Monot et al, "Microstructure and flux pinning properties of melt textured grown doped YBa2Cu3O7-d" Physica C, 1997, (274), 253-256.*

* cited by examiner

US 7,820,596 B2

THICK FILM HIGH TEMPERATURE SUPERCONDUCTING DEVICE SUPPORTING HIGH CRITICAL CURRENTS AND METHOD FOR FABRICATING SAME

CROSS REFERENCE TO RELATED APPLICATIONS

The present application is the U.S. National Phase of International Patent Application Serial No. PCT/US2001/051078, filed on Oct. 23, 2001, which claims the benefit of U.S. Provisional Patent Application Ser. No. 60/242,586, filed on Oct. 23, 2000, and U.S. Provisional Patent Application Ser. No. 60/246,935, filed on Nov. 11, 2000. International Patent Application Serial No. PCT/US2001/051078 published in English as WO 02/045133 A3 on Jun. 6, 2002. The foregoing applications are hereby incorporated by reference in their entireties.

NOTICE OF GOVERNMENT RIGHTS

The U.S. Government has certain rights in this invention pursuant to the terms of the National Science Foundation award DMR-93-50464.

BACKGROUND OF THE INVENTION

I. Field of the Invention

The present invention relates to high temperature superconductor devices, and more specifically, to thick film superconductor devices having refined twin spacing and which maintain a large critical current.

II. Description of the Related Art

In recent years, extensive work has been conducted in the area of high temperature superconductors. Researchers have worked to develop materials which not only exhibit superconductivity at high temperature $T_c$, but which also are able to carry a large critical current density $J_c$. In particular, those skilled in the art have conducted numerous experiments with cuprate compounds in an attempt to develop superconductor devices which meet the foregoing criteria.

It is generally known that mechanical structures called "twins" form during certain crystal lattice transformations in cuprate compounds in order to reduce transformation strains. For example, in the article by A. Rosová et al., "Role of Microtwins in Twin Lamella Intersections and Interconnections in $YBa_2Cu_3O_{7-y}$," Physica, vol. C 214, p. 274 (1993), it is disclosed that mechanical twins form spontaneously in order to relieve strains during a ferroelastic phase transition when $YBa_2Cu_3O_{7-d}$ material is cooled in the presence of Oxygen. Rosová et al. disclose a technique for making a high temperature superconductor ($T_c$=92-93K) by preparing doped $YBa_2Cu_3O_{7-d}$ material, i.e., crystalline $YBa_2(Cu_{0.97}Au_{0.03})_3O_{7-d}$, in a gold crucible and annealing the material in oxygen to induce twinning.

Further discussions of the mechanical effects of twinning and the formation of secondary microtwins are presented in articles by Y. Zhu et al., "The Interface of Orthogonally Oriented Twins in $YBa_2Cu_3O_{7-d}$," Philosophical Magazine, vol. 67, A 1057 (1993), K. N. R. Taylor et al., "Intersections of Twins and of Optical Domains in Crystalline $YBa_2Cu_3O_{7-d}$," J. Crystal Growth, vol. 117, p. 221 (1992), and T. M. Shaw et al., "The Effect of Grain Size on Microstructure and Stress Relaxation in Polycrystalline $YBa_2Cu_3O_{7-d}$," J. Matter. Res., vol. 4, p. 248 (1989).

Although the phenomenon of twinning in $YBa_2Cu_3O_{7-d}$ superconductors is well documented, the mechanism by which twins impact superconducting behavior has been far less understood. It is known that when a current of density J flows in a mixed-state superconductor along a direction normal to an applied magnetic field B, the individual lines of magnetic flux are subjected to the Lorentz force, also called the Magnus force, F=J×B. Under most circumstances, as the applied magnetic field B increases, the superconducting current density J is degraded by the resulting Lorentz force. When there are few pinning centers to provide enough pinning, flux-lines will move with the Magnus force and there will be finite resistance and $J_c$ will drop. However, in cuprate superconductors where twinning has occurred, lines of magnetic flux are "pinned" by the twin boundaries in the superconductor, and the magnetic flux is, at least to some extent, prevented from moving with the Lorentz force.

One article which examines the impact of twinning in $YBa_2Cu_3O_{7-d}$ superconductors is V. K. Vlasko-Vlasov et al., "Study of Influence of Individual Twin Boundaries on the Magnetic Flux Penetration in $YBa_2Cu_3O_{7-d}$," 72 Physical Review Letters 3246 (1994). That article discloses a $YBa_2Cu_3O_{7-d}$ high temperature superconductor formed by growing a $YBa_2Cu_3O_{7-d}$ crystal in a gold crucible. According to V. K. Vlasko-Vlasov et al., twin boundaries in the crystal act as pinning barriers which disrupt magnetic flux penetration of the superconductor, i.e., vortices of flux cannot easily pass through the boundaries and pile up on one side of the superconductor. Thus, with an applied magnetic field of 73 Oe, a critical current $J_c$=1.7×10$^4$ A/cm$^2$ was measured by the authors in a twinned region of the superconductor as compared to an expected critical current of $J_c$=1.7×10$^3$ A/cM$^2$ for an untwinned region.

Although V. K. Vlasko-Vlasov et al. explain that twin regions in a $YBa_2Cu_3O_{7-d}$ superconductor serve to disrupt magnetic flux penetration of the superconductor, this reference does not suggest any way of inducing or effectively utilizing such twin regions in a superconducting device.

Improvements in cuprate superconductor materials can be obtained by emphasizing and promoting the formation of secondary microtwin structures which facilitate strong flux pinning. This is described more fully in International Patent Publication WO 99/03159, published on Jan. 21, 1999, entitled "High Temperature Superconducting Device Having Secondary Microtwin Structures that Provide Strong Pinning," which is incorporated by reference herein in its entirety.

One problem observed in superconductor materials relates to the properties of twins in thick film structures. As used herein, term "thick film" refers to coatings on a substrate which have a film thickness of 1 micron or more. In YBCO films less than 1 micron thick, such as 0.2 microns, twin spacings are generally small with respect to the film thickness and such films exhibit a desirably high critical current density. However, such films are not generally practical for many coated conductor applications, such as power transmission applications, where film thickness of 1 micron or larger are required. Previously, as film thickness was increased, the average twin boundary spacing has tended to increase as well. This results in a lower twin density and a drop off in the critical current density in superconducting films having a thickness of 1 micron or more.

Accordingly, there remains a need for improved methods and materials for thick film superconductor materials.

SUMMARY OF THE INVENTION

In accordance with the present invention, a thick film superconductor is formed which includes a substrate and a superconducting thick film formed on the substrate. The thick film has a film thickness in the range of 1-20 microns and exhibits an average local twin spacing distance. The ratio of the average twin spacing distance to the film thickness is less than about 0.016. For example, for a thick film having a film thickness of about 1.8 microns, twin spacing of less than 1000 Angstroms can be achieved, such as around 300 Angstroms.

A method of forming a thick film superconductor in accordance with the present invention includes forming a precursor solution of YBC ions and doping the solution with particulate rare earth oxide particles having a diameter in the range of about 50 to 500 nm (nanometer). The doped solution is applied to a substrate in a substantially uniform layer and is heat treated in an oxygen environment to form a YBCO layer having the orthorhombic crystalline phase. The heat treatment is such that substantially complete oxygenation of the YBCO matrix is achieved.

In one embodiment, the rare earth oxide particles are $CeO_2$ and preferably have an average diameter of about 120 nm. It is preferred that the doping step includes adding about 25% by volume of rare earth oxide. The rare earth oxides generally take the form or $ReO_2$ or $Re_2O_3$, where Re represents a member of the group of rare earth metals.

The applying step provides a film having a thickness in the range of about 1 to 20 microns. After the heat treating step, the film exhibits twins having an average local twin spacing which is less than 1000 Å (Angstroms) and has a ration of about 0.016 times the film thickness.

The heat treating step preferably includes a prolonged cooling phase, which is selected to promote full oxygenation of the superconducting film. For example, the cooling phase preferably results in the formation YBCO in the orthorhombic phase having the form $YBa_2Cu_3O_{6.9}$. In one embodiment, the cooling phase has a temperature versus time slope of less than 15° C./hour. The heat treating step can also include annealing in an oxygen environment at a temperature in the range of 660-700° C. at a pressure of one atmosphere. The temperature range can be increased if the pressure during oxygenation is increased beyond one atmosphere.

Another method in accordance with the present invention includes fabricating a superconducting material having refined twin structures by subjecting YBCO in the tetragonal crystalline configuration to annealing at a temperature of at least 660° C. and cooling the YBCO from the annealing temperature at a rate less than 15° C./hour in an oxygen environment. This method is applicable to bulk YBCO as well as YBCO formed as a thick film having a film thickness greater than 1 micron. The cooling rate is selected to achieve substantially full oxygenation of the YBCO matrix, such as evidenced by the formation of $YBa_2Cu_3O_{6.9}$.

These and other objects and features of the invention will become apparent from the following detailed description of preferred embodiments which is to be read in conjunction with the accompanying drawings.

DESCRIPTION OF THE PREFERRED EMBODIMENTS

In general, the present invention provides a technique for effectively utilizing twinning and microtwinning in certain cuprate compounds, e.g., $YBa_2Cu_3O_{7-d}$, in order to provide a superconducting device which is able to maintain a large critical current, even in thick films.

Figure 1:
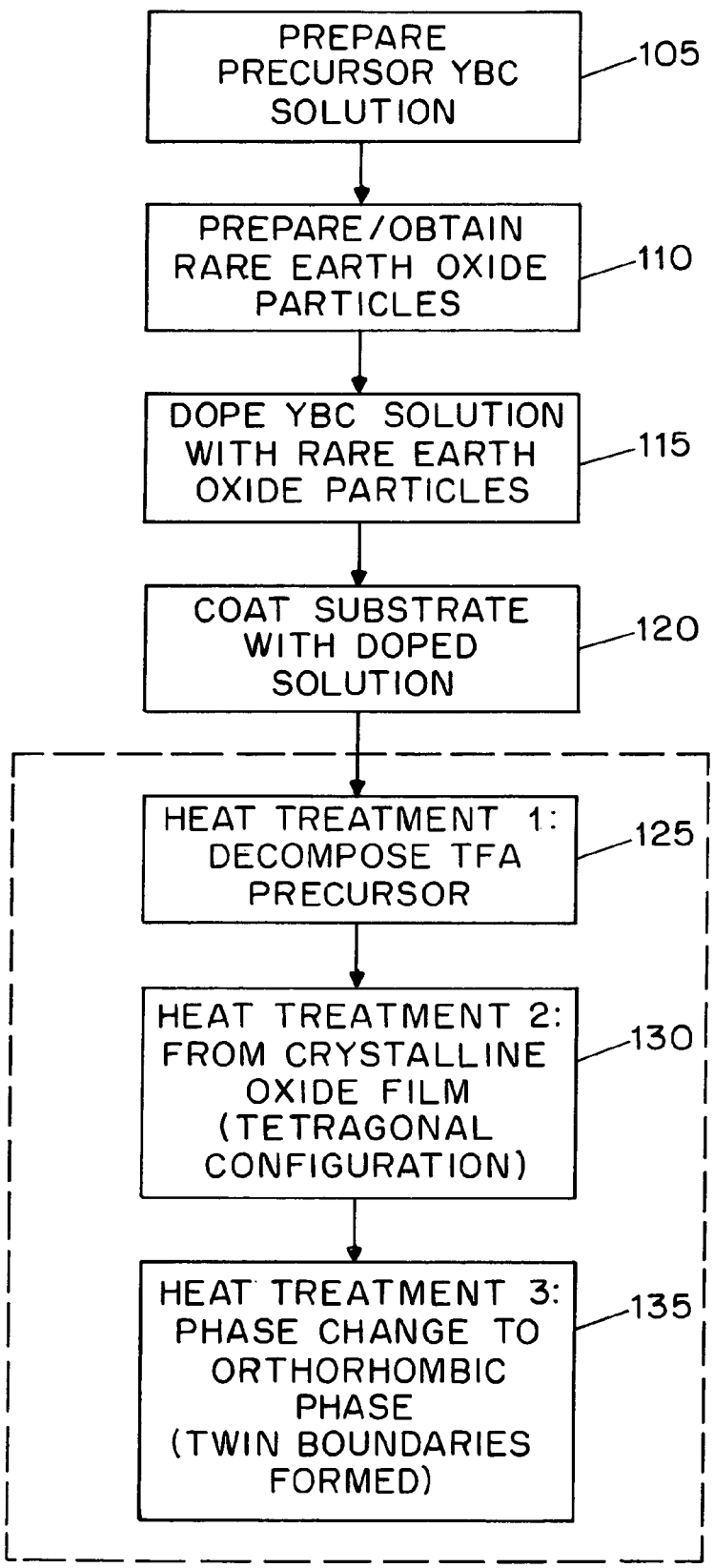
FIG. 1 is a flow chart illustrating a method of forming a thick film superconductor material.

While the majority of work with respect to twin engineering of superconductors has been performed in connection with melt-textured grown (MTG) pellets, new techniques are needed to form a twin engineered thick film superconducting film. Such techniques will be useful in the manufacture of coated conductors, which can be used, for example, in electrical power transmission applications. FIG. 1 is a flow chart illustrating a method of forming a thick film superconductor material in accordance with the present invention.

Referring to FIG. 1, the process begins with the formation of an aqueous solution of YBC ions in a triflouroacetic acid solution (step 105). In this regard, triflouroacetic acid can be reacted with appropriate amounts of $Y_2O_3$, $BaCO_3$ and CuO to form TFA salts in a stoichiometric mixture yielding Y:Ba:Cu=1:2:3. The TFA salts can then dissolved in a volume of methanol to form a 1 molar concentration of YBC ions.

Figure 2:
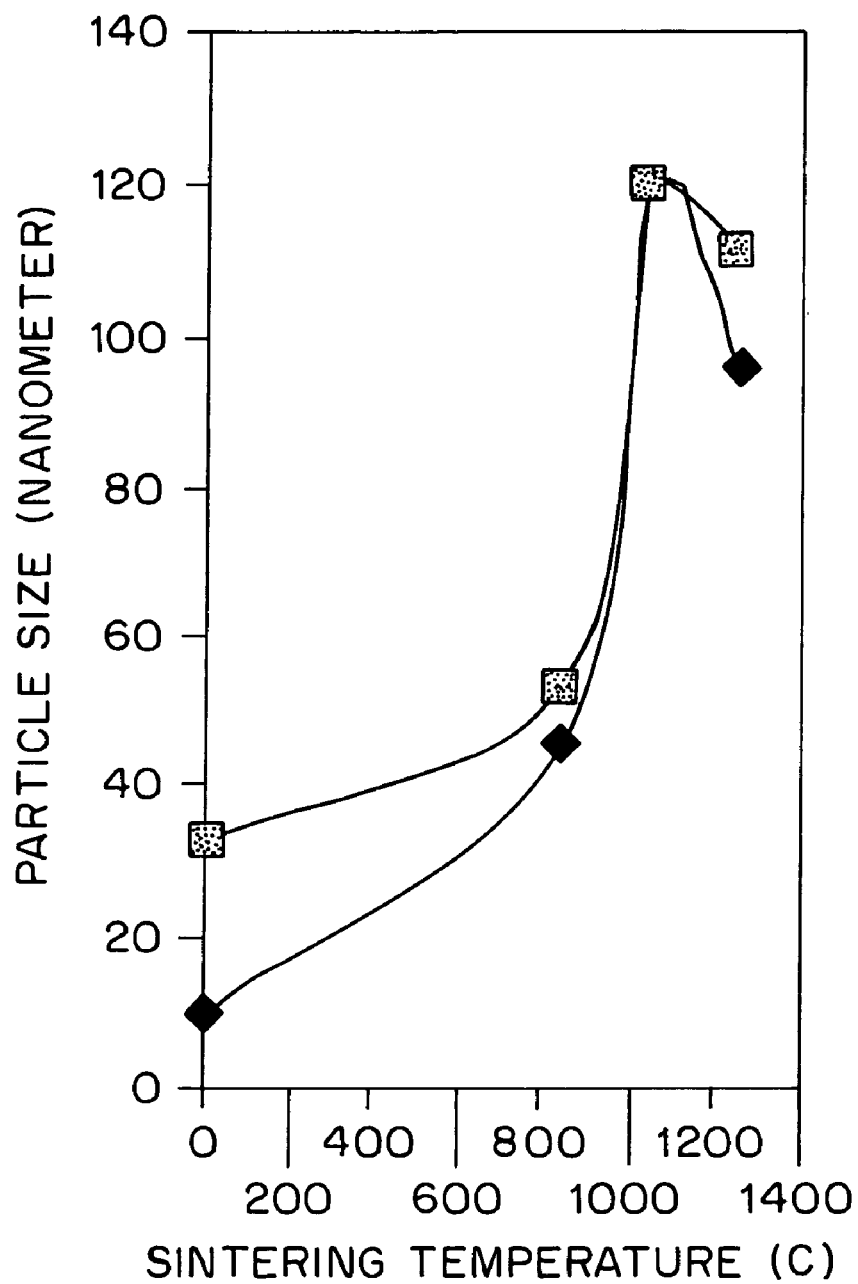
FIG. 2 is a graph of sintering temperature versus particle size for the production of $CeO_2$ particles.

The YBC solution will be doped with rare earth oxide particles. The particles, such as $CeO_2$, should have an average particle size in the range of 50-500 nanometers (nm). $CeO_2$ particles having a diameter of 120 nm have been found to produce especially desirable results. There are a number of known methods for producing rare earth oxides of the desired particle size. Alternatively, suitable $CeO_2$ particles can be fabricated using a first solution of 2.209 grams of Ce $(NO_3)_3.6(H_2O)$ in 750 mL of triple distilled (ID) water and a second solution of 52.5 grams of hexamethylenetetraamine (HMT) in 750 mL of TD water which are premixed for 1.5 hours. The two solutions are combined and then mixed for about 24 hours. The $CeO_2$ particles are then harvested, such as by centrifugation. The particles can then be sintered in accordance with the graph in FIG. 2 to provide the desired particle size. For example, sintering at about 1050° C. will result in $CeO_2$ particles having a diameter of about 120 nm.

After rare earth oxide particles of suitable diameter have been obtained (step 110), the YBC precursor solution is doped by the addition of these particles (step 115). In one embodiment, 25% by volume of 120 nm diameter cerium oxide particles are added to the YBC solution. The volume percent is based on the volume of the final thick film material.

The doped solution is then applied to a substrate (step 120). The process of applying the solution to the substrate will vary depending on the substrate geometry, substrate material and desired coating characteristics. The solution can be applied by dip coating, spray coating, spin coating or other known methods of deposition. As an example, the above solution can be used to form a film having substantially homogenous composition, thickness and distribution on a yttria stabilized zirconia (YSZ) single crystal planar substrate using spin coating. By controlling the properties of deposition, such as the spin rate, the viscosity of the solution, the acceleration time and spin time, coatings of various thickness can be achieved. The desired film thickness will vary depending on the intended application. For coated conductors, it is desirable to have a film thickness greater than 1 micron and preferably in the range of 1-20 microns. After spin coating, the coated sample is allowed to air dry for a period of about 6-12 hours.

The sample is then subjected to heat treatment to form a layer of YBCO exhibiting the Orthorhombic phase, preferably in the form $YBa_2Cu_3O_{6.9}$. The heat treatment allows full oxygenation of the YBCO layer. The resulting superconducting film will exhibit twin structures with a refined twin spacing. The twin spacing $T_w$ will be very small with respect to the film thickness $T_F$, which results in a large twin density and increased critical current density, $J_c$. For example, in a film of 1.8 microns, twin spacing of about 288.4 angstroms can be achieved. This results in a ratio of twin spacing to layer thickness ($T_w/T_F$) of 0.016 and less.

Figure 3:
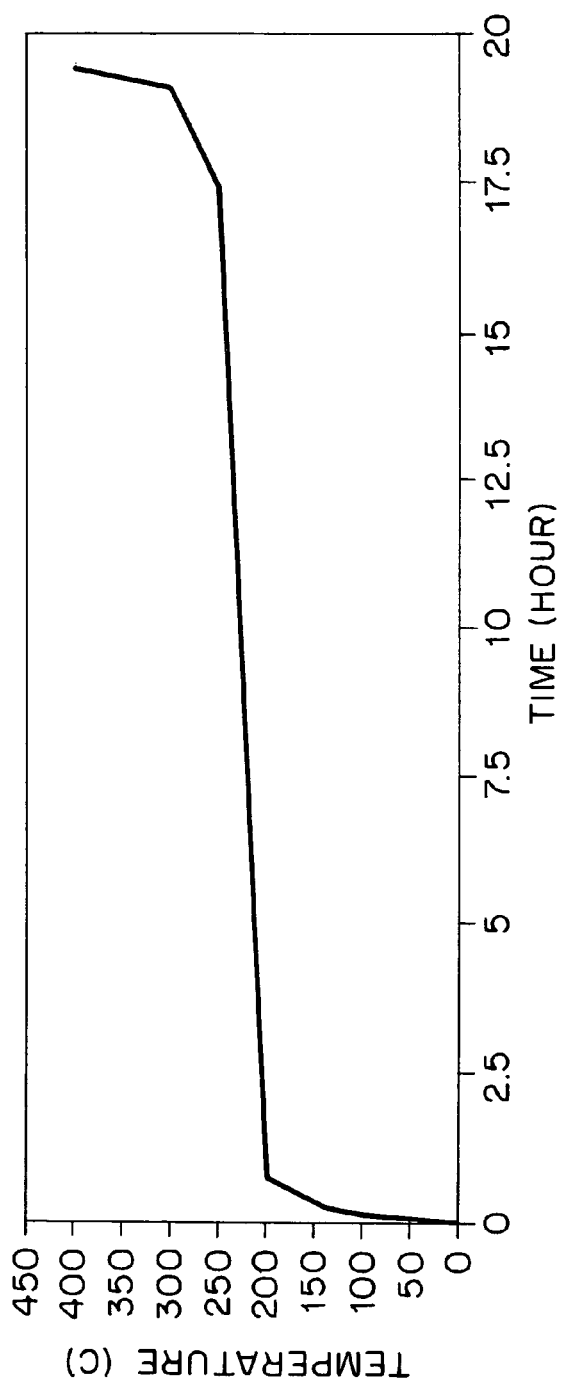
FIG. 3 is a graph of temperature vs. time illustrating a temperature profile suitable for decomposing a TFA precursor to from oxyflouride intermediates.

An exemplary heat treatment process is illustrated in steps 125, 130 and 135. In step 125, the dried doped solution, which is a TFA precursor, is decomposed into oxyflouride intermediates. This can be achieved by heating the material under humid oxygen conditions in accordance with the temperature profile illustrated in Table 1 set forth below and in the graph of FIG. 3.

TABLE 1

HEAT TREATMENT ONE

| Step | Starting Temp (C.) | Ending Temp (C.) | Rate (C./min) | Time (min) |
|---|---|---|---|---|
| 1 | 25 | 105 | 10 | 8 |
| 2 | 105 | 140 | 5 | 7 |
| 3 | 140 | 200 | 2 | 30 |
| 4 | 200 | 250 | 0.05 | 1000 |
| 5 | 250 | 300 | 0.5 | 100 |
| 6 | 300 | 400 | 5 | 20 |

Although the particular temperature profile of Table 1 has been found to provide the desired TFA decomposition, it will be appreciated that other time-temperature curves can be used to achieve a substantially similar result.

Figure 4:
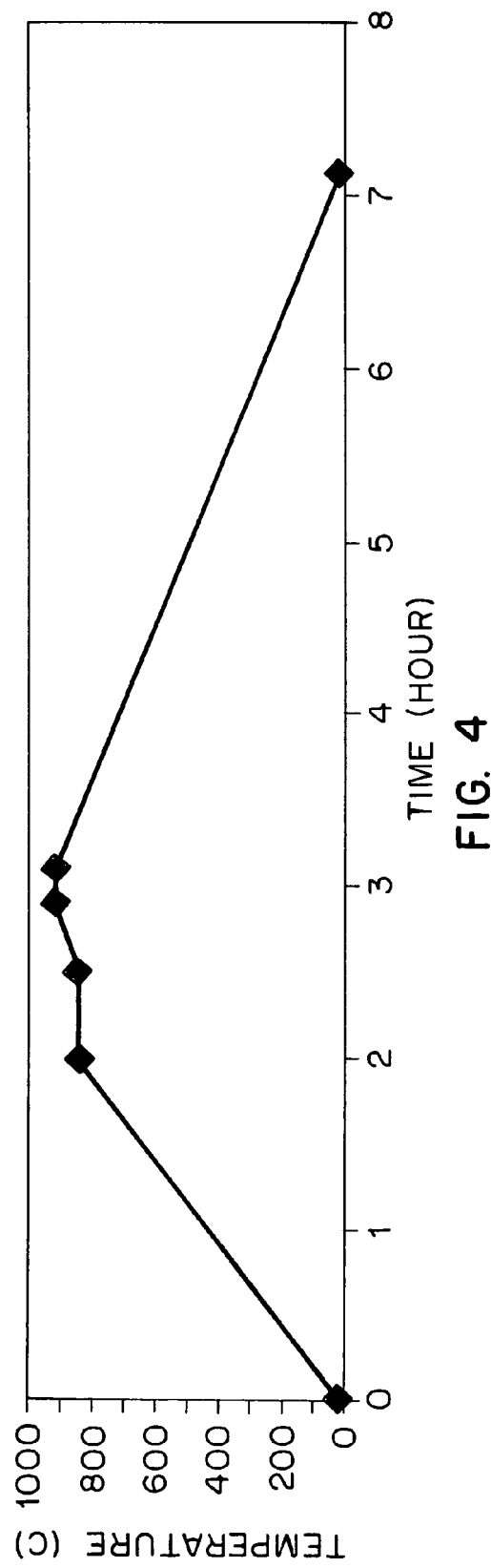
FIG. 4 is a graph of temperature vs. time illustrating a temperature profile suitable for converting oxyflouride intermediates into crystalline oxide films having a tetragonal crystalline configuration.

After the TFA precursor is decomposed to form the oxyflouride intermediates, the material is then subjected to a second heat treatment process which converts the oxyflouride intermediates into a crystalline oxide film of tetragonal modification. An example of a suitable heat treatment profile is set forth below in Table 2 and is illustrated in the graph of FIG. 4.

TABLE TWO

HEAT TREATMENT # 2:

| Period | Starting Temp (C.) | Ending Temp (C.) | Mode | Rate (C./hr)/ Time (hr) | Presence |
|---|---|---|---|---|---|
| 1 | 25 | 850 | Ramp | 400 C./hr | Humid He |
| 2 | 850 | 850 | Dwell | 0.5 hr | Humid He |
| 3 | 850 | 920 | Ramp | 300 C./hr | Dry He |
| 4 | 920 | 920 | Dwell | 0.2 hr | Dry He |
| 5 | 920 | 25 | Ramp | 200 C./hr | Dry Oxygen |

Referring to the last column of Table 2, the samples are heated first in a humid helium environment periods 1 and 2) then a dry Helium environment periods 3 and 4) and then cooled in a dry Oxygen environment (period 5). Heat treatment in a humid environment allows the oxyflouride salts to react with the $H_2O$ to release small amounts of HF and provide a mixture of oxides which can be transformed into YBCO. It is also expected that Oxygen can be used in place of Helium in the first four steps, especially in those cases where the oxyflouride salts do not contain sufficient levels of Oxygen.

Figure 5:
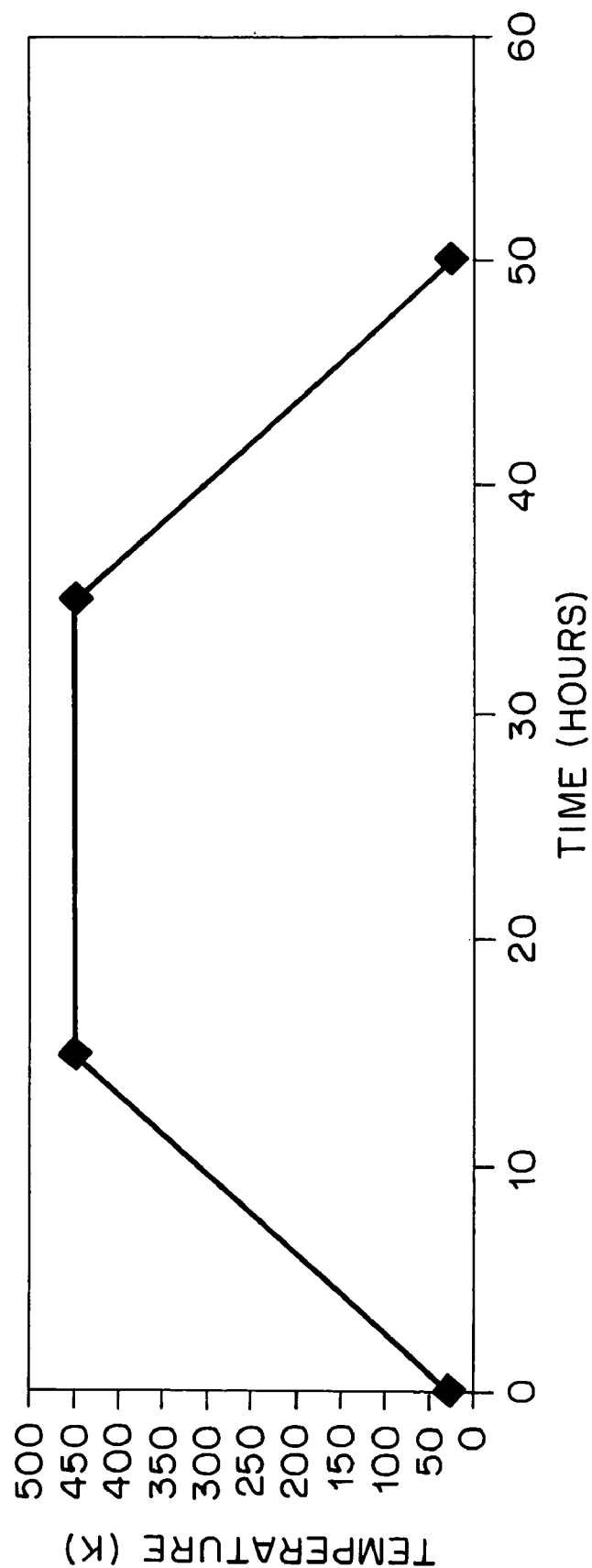
FIG. 5 is a graph of temperature vs. time illustrating a first temperature profile suitable for promoting a phase change from the tetragonal to the orthorhombic phase.

Finally, to form a superconducting film having the desired properties, the sample is subjected to a third heat treatment operation to promote a phase change from the tetragonal crystalline arrangement to the orthorhombic phase. Referring to Table 3 below and the graph of FIG. 5, the samples are first heated under humid oxygen conditions (steps 1 and 2) and then slowly cooled under a dry oxygen environment.

TABLE THREE

HEAT TREATMENT # 3

| STEP | STARTING TEMP (C.) | ENDING TEMP (C.) | DURATION (HRS) |
|---|---|---|---|
| 1 | 25 | 450 | 15 |
| 2 | 450 | 450 | 20 |
| 3 | 450 | 25 | 15 |

The resulting samples will exhibit a superconductor thick film having a thickness in the range of 1-20 microns. The film will exhibit twins which have a fine average twin spacing which results in higher twin density and a higher critical current density. As compared to the thickness of the film, the average twin spacing $T_w$ will be less than 1000 Angstroms and will be very small with respect to the film thickness $T_F$. For example, in a film having a thickness of 1.8 microns, twin spacing of about 288.4 angstroms can be achieved. This results in a ratio of twin spacing to layer thickness ($T_w/T_F$) of 0.016. This result is surprising since in previous thick films superconductors, such as undoped YBCO, having a thickness greater than 1 micron, twin spacing generally increases as the film thickness increases.

An alternative heat treatment process can also be used to decrease twin spacing and increase twin density. It is recognized that twin boundary energy generally decreases as oxygenation temperature increases. It has been found that by fully oxygenating the $YBa_2Cu_3O_{7-y}$ lattice, improved twin density and increased critical current density result. Preferably, the lattice is oxygenated to a form of $YBa_2Cu_3O_{6.9}$. This has been achieved in MTG YBCO samples using a heat treatment profile which involves heating to a temperature between 660-700° C. and then slowly cooling the material in an oxygen environment.

Figure 6:
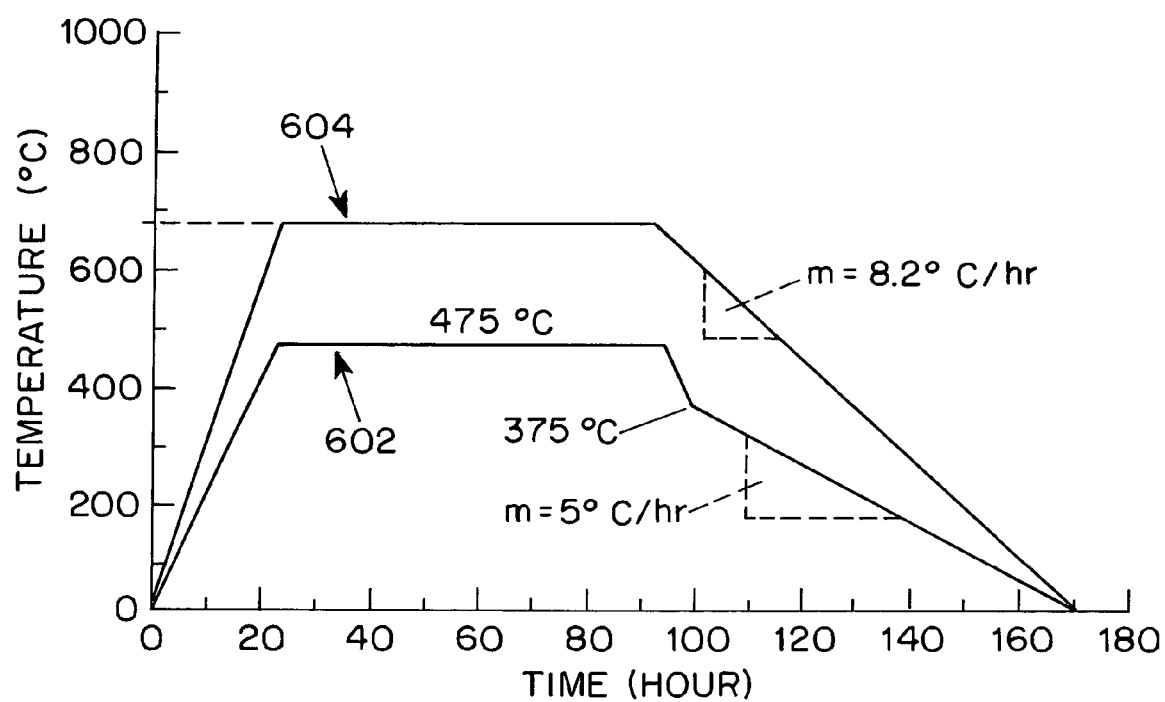
FIG. 6 is a graph of temperature vs. time illustrating a temperature profile for annealing a superconductor material followed by slow cooling in an oxygen environment.

The combination of the higher oxygenation temperature and slow cooling result in a more complete oxygenation of the YBCO. This results in an increase in twin density and an improvement in flux pinning. This contributes to a substantial increase in the critical current density of the resulting material. FIG. 6 is a graph illustrating the temperature versus time profile which can be used to achieve improved oxygenation of the superconducting material.

The graph of FIG. 6 illustrates a time versus temperature profile with slow oxygenation cooling. In the first time period, from 0-20 hours, the temperature is ramped up from ambient temperature to an annealing temperature. It has been found that raising the oxygenation temperature from the conventional range of about 475° C. (curve 602) to about 680° C. (curve 604) provides superior results. In certain experiments, a significant improvement in twin spacing and critical current density was noted by increasing the oxygenation temperature from 650° C. to 680° C.

The samples are annealed at a substantially constant annealing temperature for a duration of about 70 hours in an oxygen environment. Cooling then takes place from the annealing temperature to ambient temperature in an oxygen environment over a long period. Unlike prior processes where isothermal cooling would take place at rate greater than 25° C./Hr (450° C./15 Hr=30° C./hr), it has been found that cooling in an oxygen rich environment at a rate less than 15° C./Hr, and preferably less than 10° C./Hr, results in far superior results. This process results in YBCO which is oxygenated to a form of $YBa_2Cu_3O_{6.9}$. It will be appreciated that other time-temperature-profile curves can be employed to fully oxygenate the YBCO matrix and result in this desired form.

Such methods have been applied in evaluating the decrease of twin boundary energy with increasing oxygenation temperature up to 680° C. The decreasing twin boundary energy induces finer twin spacing. The energy of a twin boundary can also be measured analytically using techniques referred to as the twin-spacing method and the twin-tip method. Such methods are described more fully in the article entitled "Shape of a Twin as Related to the Inelastic Forces Acting on Twinning Dislocations in $YBa_2Cu_3O_{7-d}$" by Boyko et al., published in the Physical Review B, Vol. 63, 224521, May, 2001, which is hereby incorporated by reference in its entirety.

The upper limit on the oxygenation temperature, at one atmosphere, is about 700-750° C. However, it is expected that as the oxygen pressure is increased beyond one atmosphere, higher oxygenation temperatures can be used to achieve the desired result.

The above slow cooling process was applied to 0.5 wt % $PtO2$ & 28.6% 211 and 71.4% 123, Melt Textured Grown samples. Samples oxygenated at 680° C. exhibited a reduced average twin boundary spacing from 1900 Angstroms (450° C.) to about 540 Angstroms. Such samples also exhibited increased critical current density, with Jc (77K, 1T) increasing in the samples processed at 680° C. from 10,000 A/cm$^2$ (450° C.) to 31,920 A/cm2.

The spacing of the resulting twin structures can be determined using known, microstructural analysis techniques, such as using TEM or X-ray analysis of the resulting lattices.

The foregoing merely illustrates the principles of the invention. Various modifications and alterations to the described embodiments will be apparent to those skilled in the art in view of the inventors teachings herein. For example, while the above description disclosed $CeO_2$ doping, other rare earth oxides may also be used. Likewise, although the foregoing embodiments were described with reference to $YBa_2Cu_3O_{7-d}$, other cuprate compounds which generally follow the chemical formula $Y_{1-x}Re_xBa_2Cu_3O_{7-d}$ where X is between 0-1 and "Re" is a rare earth metal, e.g., Yb, Sm, Nd or La, may be used to form the high temperature superconductor device.

It will thus be appreciated that those skilled in the art will be able to devise numerous systems and methods which, although not explicitly shown or described herein, embody the principles of the invention and are thus within the spirit and scope of the invention.

The invention claimed is:

1. A thick film superconductor comprising:
a substrate; and
a superconducting thick film formed on the substrate, the thick film having a film thickness in the range of 1-20 microns and exhibiting an average local twin spacing distance, the ratio of the average twin spacing distance to the film thickness being less than about 0.016.

2. The thick film superconductor of claim 1, wherein the thick film comprises $YBa_2Cu_3O_{6.9}$.

3. The thick film superconductor of claim 1, wherein the film thickness is at least equal to about 1.8 microns.

4. The thick film superconductor of claim 1, wherein the average twin spacing distance is less than about 1000 Angstroms.

5. The thick film superconductor of claim 1, wherein the film thickness is greater than about 1.5 microns and the average twin spacing distance is less than about 1000 Angstroms.

6. A method of forming a thick film superconductor comprising:
forming an aqueous solution of YBC ions;
doping the solution with particulate rare earth oxide particles having a diameter in the range of about 50 to 500 nm;
applying the doped solution to a substrate in a substantially uniform layer; and
heat treating the coated substrate in an oxygen environment to form a YBCO layer having the orthorhombic crystalline phase.

7. The method of forming a thick film superconductor of claim 6, wherein the rare earth oxide particles are $CeO_2$.

8. The method of forming a thick film superconductor of claim 6, wherein the doping step comprises use of about 25% by volume of rare earth oxide.

9. The method of forming a thick film superconductor of claim 6, wherein the particle diameter is in the range of about 100-150 nm.

10. The method of forming a thick film superconductor of claim 6, wherein the applying step provides a film having a thickness in the range of about 1 to 20 microns.

11. The method of forming a thick film superconductor of claim 10, wherein the heat treating step is applied to promote the formation of twins having an average local twin spacing which is less than about 0.016 times the film thickness.

12. The method of forming a thick film superconductor of claim 6, wherein the heat treating step includes a prolonged cooling phase, the cooling phase being selected to promote full oxygenation of the YBCO film.

13. The method of forming a thick film superconductor of claim 12, wherein the cooling phase results in the formation of $YBa_2Cu_3O_{6.9}$.

14. The method of forming a thick film superconductor of claim 12, wherein the cooling phase has a temperature versus time slope of less than 15° C./hour.

15. The method of forming a thick film superconductor of claim 6, wherein the heat treating step includes annealing in an oxygen environment at a temperature in the range of 660-700° C. at a pressure of one atmosphere.

16. A method of fabricating a superconducting material having refined twin structures comprising:
subjecting an oxide superconductor sample comprising YBCO to annealing at a temperature between 660° C. and 700° C.; and
cooling the sample from the annealing temperature at a rate less than 10° C./hour in an oxygen environment.

17. The method of claim 16, wherein the YBCO is melt texture grown bulk YBCO.

18. The method of claim 16, wherein the sample is a thick film having a film thickness greater than 1 micron.

19. The method of claim 16, wherein the cooling rate is selected to achieve the formation of $YBa_2Cu_3O_{6/9}$.

20. The method of claim 16, wherein the sample comprises $YBa_2Cu_3O_{7-d}$, $Y_2BaCuO_5$ and a doping material.

21. The method of claim 20, wherein the doping material is $PtO_2$.

22. The method of claim 16, wherein the annealing temperature is about 680° C.

* * * * *